US010702847B2

(12) United States Patent
Spitzl

(10) Patent No.: US 10,702,847 B2
(45) Date of Patent: Jul. 7, 2020

(54) METHOD AND DEVICE FOR THE PLASMA-CATALYTIC CONVERSION OF MATERIALS

(71) Applicant: Ralf Spitzl, Troisdorf (DE)

(72) Inventor: Ralf Spitzl, Troisdorf (DE)

(*) Notice: Subject to any disclaimer, the term of this patent is extended or adjusted under 35 U.S.C. 154(b) by 599 days.

(21) Appl. No.: 15/028,123

(22) PCT Filed: Oct. 2, 2014

(86) PCT No.: PCT/EP2014/002683
§ 371 (c)(1),
(2) Date: Apr. 8, 2016

(87) PCT Pub. No.: WO2015/051893
PCT Pub. Date: Apr. 16, 2015

(65) Prior Publication Data
US 2016/0243518 A1  Aug. 25, 2016

(30) Foreign Application Priority Data

Oct. 9, 2013  (DE) ........................ 10 2013 016 660

(51) Int. Cl.
B01J 19/12  (2006.01)
B01J 19/08  (2006.01)
H01J 37/32  (2006.01)

(52) U.S. Cl.
CPC ........... B01J 19/126 (2013.01); B01J 19/088 (2013.01); H01J 37/32192 (2013.01);
(Continued)

(58) Field of Classification Search
CPC .................... B01J 19/126; B01J 19/088; B01J 2219/0869; B01J 2219/0881;
(Continued)

(56) References Cited

U.S. PATENT DOCUMENTS 5,015,349 A  5/1991  Suib et al.
5,277,773 A  1/1994  Murphy
(Continued)

FOREIGN PATENT DOCUMENTS

DE  19927540 A1  12/2000
DE  19925493 C1  1/2001
(Continued)

OTHER PUBLICATIONS

International Search Report (with English translation) and Written Opinion dated Dec. 8, 2014 in International Application No. PCT/EP2014/002683.
(Continued)

Primary Examiner — Nicholas A Smith
Assistant Examiner — Colleen M Raphael
(74) Attorney, Agent, or Firm — Panitch Schwarze Belisario & Nadel LLP

(57) ABSTRACT

Methods and devices are provided for the plasma-catalytic conversion of materials to produce chemical base materials. The methods and devices allow a plurality of chemical processes to be carried out in a plasma-catalytic manner to produce chemical base materials from simple raw materials (for example methane and biogas) with an improved selectivity and energy balance. A hydrocarbon-containing or other starting material is reacted under the action of a plasma to produce chemical base materials, or such a starting material is converted into an intermediate product in a first step under the action of a plasma, and the intermediate product is converted into the desired base material in a subsequent step. The devices for carrying out plasma-catalytic reactions are characterized by a jet pump arranged downstream of the plasma reactor, a tubular recipient (reaction chamber) having a diameter of at least 4 cm, or a catalyst-containing wall of the recipient.

27 Claims, 7 Drawing Sheets

(52) U.S. Cl.
CPC ............... *H01J 37/32449* (2013.01); *B01J 2219/00033* (2013.01); *B01J 2219/0869* (2013.01); *B01J 2219/0881* (2013.01); *B01J 2219/0892* (2013.01); *B01J 2219/0896* (2013.01); *H01J 2237/339* (2013.01)

(58) Field of Classification Search
CPC ........ B01J 2219/0892; B01J 2219/0896; B01J 2219/00033; H01J 37/32192; H01J 37/32449; H01J 2237/339
See application file for complete search history.

(56) References Cited

U.S. PATENT DOCUMENTS

| | | | | |
|---|---|---|---|---|
| 5,319,176 | A * | 6/1994 | Alvi | B01J 19/088 219/121.36 |
| 5,750,823 | A * | 5/1998 | Wofford | B01D 53/32 423/210 |
| 6,030,506 | A * | 2/2000 | Bittenson | B01J 19/088 204/164 |
| 6,099,696 | A | 8/2000 | Schwob et al. | |
| 6,190,507 | B1 * | 2/2001 | Whealton | B01J 19/126 204/157.3 |
| 6,395,238 | B1 * | 5/2002 | Rogers | H05H 1/24 422/186.04 |
| 6,863,773 | B1 | 3/2005 | Emmerich et al. | |
| 6,884,326 | B2 | 4/2005 | Futamura et al. | |
| 7,160,521 | B2 * | 1/2007 | Porshnev | B01D 53/68 422/186.04 |
| 7,309,471 | B2 | 12/2007 | Benje et al. | |
| 7,438,869 | B1 * | 10/2008 | Fabian | B01D 53/32 422/168 |
| 8,974,743 | B2 | 3/2015 | Krull et al. | |
| 9,227,169 | B2 | 1/2016 | Spitzl et al. | |
| 2002/0127155 | A1 * | 9/2002 | Minaee | B01D 53/007 422/186 |
| 2009/0234156 | A1 * | 9/2009 | Bartos | B01D 3/009 422/187 |
| 2010/0294647 | A1 * | 11/2010 | Bayer | H05H 1/24 422/186 |
| 2011/0190565 | A1 * | 8/2011 | Novoselov | B01J 19/088 422/186 |
| 2011/0230683 | A1 * | 9/2011 | Benje | B01J 19/088 422/186.04 |
| 2013/0296458 | A1 | 11/2013 | Krull et al. | |
| 2014/0183033 | A1 * | 7/2014 | Spitzl | B01D 53/32 204/157.43 |
| 2015/0041309 | A1 | 2/2015 | Spitzl | |
| 2015/0044105 | A1 * | 2/2015 | Novoselov | B01J 19/088 422/186.04 |

FOREIGN PATENT DOCUMENTS

| | | |
|---|---|---|
| DE | 10210112 A1 | 12/2002 |
| DE | 10219723 A1 | 11/2003 |
| DE | 60024084 T2 | 8/2006 |
| DE | 202010005946 U1 | 8/2010 |
| DE | 102009031059 A1 | 1/2011 |
| DE | 102010056579 A1 | 7/2012 |
| DE | 202012101259 U1 | 7/2012 |
| DE | 102012007230 A1 | 10/2013 |
| WO | 9209351 A1 | 6/1992 |
| WO | 2004010454 A3 | 1/2004 |
| WO | 2006123883 A1 | 11/2006 |
| WO | 2012006155 A1 | 1/2012 |

OTHER PUBLICATIONS

Applicant's Response (German language) to the International Search Report and Written Opinion dated Aug. 7, 2015 in International Application No. PCT/EP2014/002683.

Notification Concerning Informal Communication with Applicant (German language) dated Sep. 25, 2015 in International Application No. PCT/EP2014/002683.

Applicant's Response (German language) to Notification Concerning Informal Communication with Applicant dated Nov. 24, 2015 in International Application No. PCT/EP2014/002683.

International Preliminary Examination Report (German language) dated Feb. 3, 2016 in International Application No. PCT/EP2014/002683.

Kovács et al., "Methane reformation using plasma: an initial study," Journal of Physics D: Applied Physics, vol. 39, pp. 2391-2400 (2006).

International Preliminary Examination Report (English translation) dated Feb. 3, 2016 in International Application No. PCT/EP2014/002683.

* cited by examiner

METHOD AND DEVICE FOR THE PLASMA-CATALYTIC CONVERSION OF MATERIALS

CROSS-REFERENCE TO RELATED APPLICATIONS

This application is a Section 371 of International Application No. PCT/EP2014/002683, filed Oct. 2, 2014, which was published in the German language on Apr. 16, 2015, under International Publication No. WO 2015/051893 A1 and the disclosure of which is incorporated herein by reference.

BACKGROUND OF THE INVENTION

The invention relates to methods for the plasma-catalytic conversion of materials, in particular for the production of key chemicals from simple starting materials. The invention further relates to devices which are particularly suitable for carrying out the methods according to the invention.

It is well known that the use of plasmas for chemical reactions, particularly of gaseous reactants, is advantageous because under the action of a plasma—due to the activation of the reaction components caused thereby—an acceleration of chemical reactions can be achieved. Therefore, such plasma-enhanced reactions are often called "plasma-catalytic". However, the use of plasmas in chemical synthesis processes, in particular for the production of key chemicals, has so far gained little importance, unlike plasma processes for purifying exhaust gases or for material processing.

BRIEF SUMMARY OF THE INVENTION

The object of the present invention was therefore to provide methods and devices suitable for these methods which enable the conversion of preferably gaseous starting materials, in particular for the preparation of key chemicals from inexpensive and readily available raw materials such as natural gas, pyrolysis gas or biogas.

Surprisingly, it has been shown that the plasma catalytic methods and devices of the present invention may be used advantageously for a variety of chemical processes, in particular for the production of the most diverse key chemicals from simple raw materials (e.g., natural gas, biogas, pyrolysis gas). The plasma-catalytic methods and devices according to the invention are characterized among other things by a favorable energy balance, increased throughput, high flow rates, improved product yields, and by improved controllability and variability of process management.

Furthermore, individual methods and devices according to the invention can be combined as modular components; for example, to make additional synthesis routes usable for the plasma-catalytic production of further compounds. A combination of two or more methods of the invention can be implemented particularly by using the product produced in a first method in at least one other method, as a starting material or as a reactant.

The invention relates to methods for the plasma-catalytic conversion of materials, in particular for the production of key chemicals. However, the present invention is not limited to the production of key chemicals. The term basic materials or key chemicals commonly refers to chemicals which are usually produced on a large scale and are used as starting materials for various industrial production processes; for example, for the production of plastics, dyes, fertilizers, adhesives, pesticides, pharmaceuticals, surfactants and detergents. In general, key chemicals are low-molecular-weight compounds having a simple structure.

The methods of the invention are characterized by the fact that (a) a hydrocarbon-containing starting material, and/or at least one starting material selected from the group comprising $CO_2$, CO, $H_2O$, $H_2$, $O_2$ and $N_2$, are/is converted with at least one further starting material, under the action of a plasma, so that the key chemicals are obtained as product(s);

or that (b) a hydrocarbon-containing starting material, and/or at least one starting material selected from the group comprising $CO_2$, CO, $H_2O$, $H_2$, $O_2$ and $N_2$, are/is converted, in a first process step, under the action of a plasma, into one or more intermediate(s) which, in at least one subsequent process step, is/are converted into said key chemical(s).

According to the former process variant (a), the said starting material(s), preferably at least one hydrocarbon-containing starting material, is/are reacted, that is, converted, with at least one further starting material, under the action of a plasma. The reaction product or reaction products formed thereby can be used as key chemical(s), as explained above.

According to the second process variant (b), the said starting material(s), preferably at least one hydrocarbon-containing starting material, is/are converted, in a first process step under the action of a plasma into one or more intermediate(s). Accurate knowledge of the chemical composition or structure of the plasma-catalytic intermediates is not absolutely necessary, but if needed they can be determined from the methods known to those skilled in the art.

The intermediate(s) obtained is/are further converted in at least one subsequent process step, which may also be implemented using a plasma.

The reaction product(s) so produced can be used as key chemical(s), as explained above. The above-mentioned subsequent process step can be performed with the addition of one or more further reactants (starting materials), optionally in the presence of one or more catalysts, in order to achieve the formation of the desired products.

For use as the hydrocarbon-containing starting materials, hydrocarbon-containing gases are preferred, particularly natural gas and biogas (typical composition: 40-75 vol % methane, 25-55 vol % $CO_2$, balance $N_2$, $H_2S$, $H_2O$ and other gases), pyrolysis gases (gases from pyrolysis processes, e.g. pyrolysis of biomass or waste); as well as gaseous hydrocarbons, particularly methane, ethane, propane, butane, isobutane; and combinations of two or more of the foregoing. In general, saturated and unsaturated, branched and unbranched hydrocarbons, and aromatic hydrocarbons, and mixtures of such hydrocarbons, are suitable, as well as substance mixtures containing such hydrocarbons.

However, the invention is not limited to the use of gaseous starting materials; for example, liquid starting materials (especially oils, e.g. pyrolysis oils) or gasifiable hydrocarbons can be used, which under the conditions prevailing in the plasma are transformed into the vapor or gas phase, or solid starting materials which are preferably present in the form of particles. Solid or liquid starting materials are preferably used as aerosols.

Preferably, saturated hydrocarbons only are used as hydrocarbon-containing starting materials, or the proportion of saturated hydrocarbons is at any rate at least 75 vol.-%, preferably at least 85 vol.-%, in particular at least 95 vol.-%.

One advantage achieved by the present invention lies in the fact that starting from saturated hydrocarbons a wide variety of different products—including halogenated compounds, alcohols, aldehydes, ketones, carboxylic acid, CN compounds—can be synthesized.

The hydrocarbon-containing, preferably gaseous, starting material can optionally be used in combination or as a mixture with one or more other process gases, such as nitrogen, water, carbon monoxide, carbon dioxide. As process gases, inert gases can be used as well, particularly noble gases (e.g., argon, helium and/or neon). According to a further embodiment of the invention, hydrogen is used as (additional) process gas, because—if necessary—undesirable or excessive formation of carbon black can thereby be prevented or reduced.

The selection of the further starting material mentioned under (a) above is not restricted in general; it depends on the nature of the conversion reaction planned and of the desired reaction products. For example, for the production of halogenated hydrocarbons, halogens ($Br_2$, $Cl_2$, $F_2$) or halogen compounds (such as HBr, HCl, HF) can be used as "further starting materials". As "further starting materials", the aforementioned process gases (e.g., CO, water gas (CO, $H_2$), $H_2O$, hydrogen cyanide, nitrogen) are particularly suitable.

The foregoing also applies accordingly with regard to the selection of further reactants (starting materials) in the above-mentioned "subsequent process step" of process variant (b).

The subsequent process mentioned under (b) above, or at least one of the subsequent processes, can be carried out using one or more catalysts. The choice of catalyst depends on the type of the intended conversion reaction or of the desired reaction products. The catalysts suitable for any particular reaction are known to the person skilled in the art from common technical knowledge. For example, catalysts can be used that are selected from the group comprising metals (e.g., platinum, iron, nickel, etc.), ceramics (e.g. zeolites, aluminum or zirconium oxide), heavy metal acetylides (especially copper acetylide), metal carbonyls and metal carbonyl hydrides.

Even if the conversion of the starting materials, as mentioned above, takes place plasma-catalytically, it may occasionally be necessary or advantageous that this reaction be carried out, entirely or partially, in the presence of one or more catalysts. These catalysts can be introduced into the reaction space (plasma chamber), in which the plasma-enhanced conversion takes place; for example, in the form of (nano)particles. These catalyst particles can be recycled; for example, by being separated by a cyclone separator from the gaseous product stream and then fed back into the reaction chamber of the plasma reactor. With regard to the selection of suitable catalysts, the above statements apply.

Suitable catalysts are, in particular, fixed-bed catalysts, formed catalyst bodies, catalysts present in dissolved form, catalysts present in suspended or dispersed form, or catalysts present in particulate form (powder, dust); also, two or more different types of catalysts can be combined.

The product, or at least one of the products, formed in the plasma-catalytic reaction, or the intermediate product or at least one of the intermediate products can be introduced into an intermediate storage device before it is converted in a subsequent process step. This is advantageous particularly because it allows or facilitates a continuous operation of the, or a, subsequent process step.

If the plasma-catalytic conversion described above (a, b) leads to a mixture of two or more products or intermediate products, it may also be advantageous, to store this product mixture (or the product stream containing this mixture) in an intermediate storage device before it is subjected to a further treatment (e.g. fractionating, purifying, concentrating, extracting).

For the inventive plasma-catalytic conversion, non-thermal plasmas are preferably used, especially plasmas excited by microwaves (microwave plasmas).

Non-thermal plasmas are characterized by the fact that the types of particles contained therein are not in thermal equilibrium, and that such plasmas can be stably generated in large volumes (e.g. 1-10 liters) and in long-term operation, and that they enable high material throughputs and optimal activation of the reactants.

The use of microwave plasmas is advantageous also because in this way high selectivities in the plasma-catalytic conversion of materials can be achieved and because a formation of solid products (e.g., carbon black) can be avoided or greatly suppressed.

In this context it has surprisingly been found that the energy efficiency and the selectivity of the plasma processes, in particular of the processes of the invention, can be significantly improved by the dimensioning of the dielectric tube (recipient, in particular made of quartz glass) forming the wall of the reaction chamber. This is particularly true when the free diameter of the tubular recipient is at least 4 cm; this diameter may also be greater, especially 6 to 20 cm, for example, or larger.

Plasma reactors for the production of microwave plasmas have already been described in the state of the art (for example, WO 2004/010454; DE 10 2012 007 230.9; patent applications of the applicant/inventor of the present application); such plasma reactors are in principle suitable for carrying out the methods according to the invention and for the inventive devices. Generally, such microwave plasma sources and microwave plasma reactors are suitable and preferred as are capable of generating a non-thermal large-volume (e.g. up to 5 l or greater) plasma that is stable even in continuous or long-term operation, and enable high gas velocities (for example, 1 m/s to 500 m/s, or higher; preferably 5 to 200 m/s, particularly preferably 10 to 150 m/s). However, supersonic flow rates are possible, too.

Preferably, the inventive methods are carried out continuously, i.e. with a steady supply of starting materials (and optionally further process gases) to the microwave reactor and under continuous removal of the product stream, containing the (intermediate) products, from the reactor. Unreacted process gas or unreacted starting materials can be fully or partially separated from the product stream and recirculated into the reactor.

Preferably, the microwave plasma is operated in the inventive plasma-catalytic processes in a pressure range of 10 to 10,000 hPa, preferably in the range from 20 to 3,000 hPa, in particular in the range from 50 to 1,500 hPa, more particularly under atmospheric pressure conditions (850 to 1100 hPa, in particular from 950 to 1050 hPa; for example, for acetylene synthesis: about 200 hPa).

The plasma-catalytic processes of this invention are typically carried out at temperatures in the range of about 50 to 2000° C., in particular 100 to 1000° C. If necessary, the temperature prevailing in the reaction chamber, or plasma reactor, can be adjusted in a certain range by known heating or cooling devices (e.g. gas cooling, liquid quenching).

Preferably, the method is carried out in such a way that in the plasma reactor a pressure difference or a pressure gradient) is set, particularly a negative pressure or positive pressure relative to ambient pressure (atmospheric pressure. This can be achieved, in particular, by means of one or more of the following measures: open-loop or closed-loop control of the inflow of the fluid, especially gaseous, starting materials into the reactor, preferably by means of one or more valves and/or pumps/compressors; open-loop or closed-loop control of the outflow of gases, in particular of the product-containing plasma gas, from the plasma reactor, preferably by means of one or more valves and/or pumps.

The static pressure inside the device can be selected as desired and adapted to the respective process.

According to a preferred embodiment of the invention it is provided that the conversion of the starting materials—as mentioned above—is carried out under the action of a plasma in a plasma reactor, and that the plasma gas in the plasma reactor which contains the products or intermediate product(s) (also called "product stream"), and/or the starting materials introduced into the plasma reactor, is/are conveyed by means of a pump located downstream of the plasma reactor, in particular a jet pump (liquid jet pump). Thus, on the one hand the (intermediate) products are continuously removed from the reaction chamber of the reactor; on the other hand the negative pressure generated by the pump causes a continuous delivery of the starting materials (or of the plasma gas containing the starting materials) into the reactor. In addition, through an open-loop or closed-loop control of the delivery rate of the pump, the desired process pressure in the plasma reactor can be adjusted or regulated.

The use of a jet pump, in particular of a liquid jet pump, is particularly advantageous because it is thereby possible, through selecting the motive medium (motive fluid for the pump), to affect the process in the desired manner. The motive medium (motive fluid), which enters into the jet pump and effects the pumping action (suction) of the jet pump, can mix with the suction medium, i.e. the product stream, in the mixing chamber of the jet pump.

According to a preferred embodiment, a solvent is used as a motive fluid which is selected in such a manner that the plasma-catalytically produced product or intermediate product, or at least one of the products or intermediate products produced by means of plasma, is soluble in this solvent. In this way, the respective (intermediate) product can be continuously dissolved in the solvent serving as a motive fluid, and be separated from the product stream. The motive fluid, which has been enriched with the dissolved (intermediate) product(s) may then be conveyed further, for further treatment in appropriate devices (e.g. absorption washers/desorption washers, fractionating columns). The dissolved (intermediate) products can possibly be expelled in a known manner from the liquid medium (e.g., by temperature or pressure shift).

The use of a solvent as described above as a motive fluid for a liquid jet pump is particularly useful in the plasma-catalytic preparation of halogenated hydrocarbons. In this case, a solvent is used as a motive fluid which is selected in such a way that the plasma-catalytically produced hydrocarbon(s) is/are soluble in the motive fluid.

The use of a jet pump for conveying the product stream also offers the possibility of mixing the product stream, containing the products or intermediate products, with catalysts or reactants or other starting materials to convert the (intermediate) products in further reactions, or to achieve a more complete conversion.

For this purpose, as motive fluid for the jet pump, a liquid is selected which contains one or more catalysts or one or more reactants (or further starting materials, e.g. hydrocarbons, alcoholates or esters), preferably in dissolved or suspended form, for further conversion of the resulting intermediate products. In particular, a motive liquid can be used for the preparation of halogenated hydrocarbons which contains hydrogen halides for the halogenation of the plasma-catalytically produced intermediate products.

Instead of a liquid, another fluid, in particular a gas or gas mixture, can also be used as a motive fluid for the jet pump. The gas or gas mixture used can either be an inert gas (carrier gas), or serve as reactant(s) for further conversion of the plasma-catalytically produced (intermediate) products, or it may contain such reactants, which reactants may be present in solid form (e.g., as aerosol), liquid form (e.g., vapor, aerosol) or in gaseous form.

As an alternative (or in addition) to the above-described method of using pump motive fluids containing reactants, one can also make use of the option of passing the product stream (with the intermediates contained therein) through a (gas) washer, the washing liquid of which contains an appropriate reactant, or several appropriate reactants.

According to another preferred embodiment it is provided that the product stream, containing the intermediate product(s) or the product(s) produced plasma-catalytically, is separated, purified, fractionated, distilled, extracted or enriched by one or more separation methods. In particular, the invention provides for the plasma-catalytically generated intermediate products(s) to be separated, purified, fractionated, distilled, extracted or enriched by one or more separation methods, prior to the subsequent chemical conversion. Devices and methods suitable for that purpose, such as fractionating columns, stripping columns, membrane separation methods, etc., are known in the art.

One or more of the resulting fractions, or one or more of the separated, purified, extracted or enriched products, can then be recirculated as starting materials into the plasma-catalytic process or be used in further, possibly different, reactions as starting materials in order to obtain further product species (especially key chemicals).

Furthermore, a preferred embodiment provides for the (intermediate) product(s) or the gaseous product stream containing the (intermediate) products to be brought into contact with a liquid stream in a gas scrubber in order to pass components of the product stream (e.g. products, intermediate products, or by-products or impurities) into the liquid of the gas scrubber and thereby remove them from the product stream. Devices suitable as gas scrubbers are in principle known to those skilled in the art. Likewise, absorbers can be used, for example.

Preferably, as the scrubbing liquid, a liquid is selected in which at least one of the products or intermediates is soluble. Alternatively, a liquid can be selected in which at least one of the products or intermediate products is insoluble and is precipitated, or a liquid which causes a conversion of at least one of the products or intermediate products to a further product. For this purpose, the scrubbing liquid may contain catalysts or reactants (further starting materials), for example. It may also be advantageous to subject the product stream, containing the (intermediate) products, before it is introduced into the gas scrubber or prior to a further conversion, to fractionation or purification. Devices suitable for this purpose, such as fractionating columns, etc., are known to those skilled in the art. The resulting fractions or purified (intermediate) products can then be further treated in a gas scrubber or downstream process equipment, as described above.

Another embodiment provides for the gaseous product stream, which has been produced under the action of plasma and contains the aforementioned products or intermediate products, to be divided into two or more partial streams. These partial streams can then be further treated in different processes or by means of various chemical reactions, to obtain further products that can be used as key chemicals According to another, preferred embodiment, the method according to the invention is used for the plasma-catalytic production of fully or partially halogenated hydrocarbons. Here, hydrocarbons or hydrocarbon-containing gas mixtures (particularly methane or methane-containing gas mixtures such as natural gas, biogas or pyrolysis gas), wholly or partially halogenated hydrocarbons, or a combination of two or more of the aforementioned substances, are used as starting materials. These starting materials are by the action of a plasma (i.e. plasma-catalytically) converted to one or more intermediate product(s)—as described above—which is/are subsequently, by reaction with at least one halogen or at least one halogen-containing compound, converted to fully or partially halogenated hydrocarbons. The latter reaction may also be carried out in the absence of a plasma.

Alternatively, the above-described preparation of fully or partially halogenated hydrocarbons may also be carried out in such a manner that a hydrocarbon-containing starting material (as explained above) is reacted with at least one halogen or at least one halogen-containing compound, as an additional starting material, under the action of a plasma—as described above—whereby the desired, fully or partially halogenated hydrocarbons are obtained or, if necessary, fed to further processing.

For the above-described plasma-catalytic production of halogenated hydrocarbons, the halogens are preferably selected from the group comprising chlorine, bromine and fluorine, or/and the halogen-containing compounds are preferably selected from the group comprising HCl, HBr and HF.

According to a particularly preferred embodiment, methane or a methane-containing gas mixture (e.g. natural gas, biogas, pyrolysis gas) is used as the hydrocarbon-containing starting material, and this starting material is reacted under the action of a plasma (for example, in a plasma reactor) with chlorine gas as an additional starting material to obtain vinyl chloride (and other chlorinated hydrocarbons) as a product. Vinyl chloride can—after separation from the product mixture—be used as a key chemical for various syntheses, in particular for the production of PVC. Preferably, said starting materials are jointly introduced into a plasma reactor, where they are plasma-catalytically converted. The gas stream (product stream) containing the product (vinyl chloride) may then be conveyed, for example by means of a jet pump, out of the reactor and then subjected to various known purification processes in order to obtain pure vinyl chloride.

Preferably, the above-described plasma-catalyzed production of vinyl chloride is carried out using a catalyst, preferably an $HgCl_2$/activated carbon catalyst or another catalyst known to those skilled in the art. The catalyst is preferably admixed to the motive fluid of the liquid jet pump, as already described above.

Another preferred embodiment of the above-described plasma-catalytic method for producing vinyl chloride provides for a liquid which is selected from the group comprising hydrochloric acid, hydrochloric acid-water mixture, ethanol and mixtures of the above liquids to be used as a motive fluid of the liquid jet pump. If hydrogen chloride is added to the pumping liquid (motive fluid), the presence of chlorine gas in the plasma reaction, that is, the introduction of chlorine gas into the plasma reactor, can be dispensed with. In this case, the hydrocarbons used as starting materials (particularly methane) are activated and converted under the action of the plasma, and the intermediate products thus obtained are converted to vinyl chloride in the subsequent contact with the hydrogen chloride contained in the pumping liquid.

The hydrogen resulting from the plasma-catalytic conversion of the said starting materials (especially of hydrocarbon-containing starting materials) may be fully or partially separated from the product stream by suitable devices, for example by a separator, and subsequently either used for further synthesis processes, or be returned to the plasma reactor (circulation/recycling). In particular, the (excess) hydrogen obtained in the plasma step can be converted with chlorine gas (e.g., from electrolysis) to hydrochloric acid and then fed to the washing process, which follows the plasma-catalytic process and which consumes the hydrochloric acid, for example in the reaction to vinyl chloride.

The separation of hydrogen can be carried out, for example, by means of pressure swing adsorption (PSA) or membrane filtration (e.g., using palladium). If desired, a separation of methane from the product stream can be effected by using cryogenic processes or other known methods.

The above-described methods according to the invention, in their various embodiments, make it possible, starting from simple starting materials (such as hydrocarbons or a mixture of two or more hydrocarbons, preferably methane or a methane-containing gas mixture), to produce, by means of plasma-catalytic reaction and, optionally, further reaction steps, a variety of products or intermediate products, which can be used as key chemicals for further synthesis routes. Here, the following examples are mentioned in particular:

Vinyl esters, especially vinyl acetate; acrylonitrile; ethers, particularly dimethyl ether, diethyl ether, di-n-propyl ether; vinyl ethers, particularly methyl vinyl ether, ethyl vinyl ether, propyl vinyl ether, isopropyl vinyl ether; methanol, propargyl alcohol (2-propyn-1-ol), 2-butyn-1,4-diol, butane diols, particularly butane-1,4-diol, 2-methyl-3-butyn-2-ol (methyl butynol), 3-methyl-3-buten-1-ol (isoprenol), 3-methyl-but-1-yn-3-ol; unsaturated carboxylic acids, especially acrylic acid (propenoic acid) and methacrylic acid (2-methylpropenoic acid); acrylic esters, particularly methyl acrylate, ethyl acrylate, butyl acrylate, isobutyl acrylate, 2-ethylhexyl acrylate; acrylamide (acrylic amide); carboxylic acid amides; vinyl halides, especially vinyl chloride; benzene, styrene, cyclooctatetraene; butenyne (vinyl acetylene); chloroprene (2-chloro-1,3-butadiene); acetylene, ethylene; hydrogen cyanide and nitriles; carbon black.

According to a yet another preferred embodiment, ethyne (acetylene), ethene (ethylene) and/or ethane is obtained by the plasma-catalytic conversion of a hydrocarbon-containing starting material. These (intermediate) products can be used as starting materials in a variety of synthetic reactions; for example, acetylene can be converted by means of the known Reppe synthesis reactions. To this end, plasma-catalytic processes of the invention as described above may likewise be used in an advantageous manner.

Therefore, the following reaction types come into consideration, in particular, as reaction types that can be carried out by means of the plasma-catalytic methods of the invention: vinylation; ethynylation; hydrocarboxylation; cyclization; halogenation.

Furthermore, the products or intermediate products obtained with the process of the invention can be further reacted, modified or derivatised in different ways, for example by subsequent pyrolysis or hydrogenation stages.

Another embodiment provides for the inventive method to be used for the production of pigment black (carbon black). Here, a hydrocarbon or a mixture of two or more hydrocarbons, preferably methane or a methane-containing gas mixture, is used as a starting material, and this starting material is converted in a plasma reactor under the action of a plasma to carbon black. The removal can be effected by means of known separation methods (such as cyclones, filters).

If desired, by adding further starting materials into the plasma reactor, preferably silicon, halogens, and/or nitrogen, an additional functionalization of the carbon black can be effected. In this connection, it is advantageous that the production of pigment black and the functionalization can be performed in one step.

It is also possible and advantageous to perform two or more of the inventive methods in parallel or in a coordinated manner; in this case, in each method, different starting materials can be used and/or different conversion reactions can be carried out (e.g., by adding different reactants or catalysts) and different products can be produced.

This allows two or more of the various methods of the invention to be performed in parallel or in a coordinated manner in such a way that at least one of the starting materials involved in a first conversion reaction (e.g. CO, water gas, $H_2$, HCN, $NH_3$) is produced in a second or a further plasma-enhanced manufacturing process.

Here, the following embodiment is particularly preferred: In a first method, a hydrocarbon-containing starting material, preferably methane or a methane-containing gas is converted under the action of a plasma (i.e., in a plasma reactor) to acetylene (2 $CH_4 \rightarrow C_2H_2 + 3H_2$). This acetylene, formed as an intermediate product, is then—optionally after previous separation of by-products or impurities—converted in at least one subsequent further process to various products (e.g., key chemicals). Acetylene can be converted with at least one other starting material (reactant) and/or in the presence of one or more catalysts; other starting materials coming into consideration are, in particular, the substances already mentioned above. Particularly preferred in this connection are halogens or hydrogen halides, by means of which a reaction of acetylene to the respective vinyl halides is made possible. The reaction of acetylene with hydrogen chloride to vinyl chloride is particularly preferred in this connection.

The conversion of acetylene with the said further starting material(s) can be carried out in such a way that—as already described above—a pump, particularly a jet pump (preferably a liquid jet pump) is used for conveying the acetylene-containing product gas out of the plasma reactor, and that in this process the further starting material(s) are admixed. This is preferably done in such a way that the further starting material(s) are admixed to the motive fluid of the jet pump. Likewise, catalysts can be admixed in the same way.

The above-described conversion of acetylene with at least one further starting material (reactant) can preferably be performed via the plasma-catalytic route as well, in which case the acetylene formed as an intermediate product is passed in a second or further plasma reactor—optionally after previous separation of by-products or impurities. The further starting material(s) with which acetylene is to be reacted can either be introduced into the reactor together with acetylene, or via one or more separate line(s).

The plasma-catalytically generated acetylene can serve as an intermediate product or starting material for a variety of other reactions which are known to the person skilled in the art from general expert knowledge, in particular for the Reppe syntheses. The latter include the vinylation, ethynylation, hydrocarboxylation (this yields, inter alia, acrylic acid, acrylic esters) and cyclization (this yields, inter alia, benzene, cyclooctatetraene, styrene) of acetylene. As catalysts, heavy metal acetylides (especially copper acetylide), metal carbonyls and metal carbonyl hydrides are used in particular.

In accordance with the present invention, these further reactions, too, can be carried out plasma-catalytically, using at least one further plasma reactor, as described above. It is advantageous here that these reactions can be carried out at lower pressures.

As examples of further reactions of acetylene that can be carried out with the method according to the invention, the following are mentioned in particular:
  addition of halogens such as Br or Cl (yielding, inter alia, 1,2-dichloroethene, tetrachloroethane);
  hydrogenation (to ethene/ethane);
  conversion with HCl to vinyl chloride (catalytic conversion to vinyl alcohol/acetaldehyde possible);
  carbonylation (CO/$H_2O$, catalysts such as nickel tetracarbonyl) to carboxylic acids (such as propenoic acid);
  addition of alcohols (yielding vinyl ether);
  addition of carboxylic acids (yielding vinyl ester).

The present invention also includes methods for the plasma-catalytic production of CN compounds, or other nitrogen-containing compounds, particularly hydrogen cyanide or ammonia, wherein a methane-nitrogen mixture, hydrogen-nitrogen mixture, and/or a water-nitrogen mixture is reacted under the action of a plasma, in particular of a microwave plasma.

In the following, some preferred applications and embodiments of the method according to the invention will be described by way of example, by means of which different products (or key chemicals), as described below, can be obtained:

1) Plasma-Catalytic Method for the Production of Vinyl Chloride Monomer

Here, methane and chlorine gas ($Cl_2$) are used as gaseous starting materials (reactant gases); alternatively or additionally, chlorinated hydrocarbons, particularly 1,2-dichloroethane, or ethylene may be used.

The reactant gases are passed via a feed line or an inlet into a plasma reactor, preferably a microwave plasma reactor. As the plasma reactor, a device according to the invention is preferably used, as described further below in greater detail—also with reference to the drawings.

By means of a liquid jet pump downstream of the plasma reactor (as mentioned further above), the pressure in the plasma reactor can be adjusted to the desired process pressure. In the mixing chamber of the jet pump, there occurs a mixing of the product stream, being delivered by the pump, with the motive fluid (pumping liquid) of the pump.

As a pumping liquid (motive fluid) for the jet pump, hydrochloric acid or a hydrochloric acid-water mixture can be used, for example. The addition of hydrogen chloride to the motive fluid is particularly advantageous because in this case the use of chlorine gas ($Cl_2$) as a reactant gas in the inlet of the plasma reactor can be dispensed with.

Furthermore, it is advantageous for the plasma-catalytic preparation of vinyl chloride if, in addition, a catalyst is used; for example, $HgCl_2$/activated carbon. The catalyst may be introduced together with the reactant gases (starting materials) into the reactor or be mixed with the motive fluid of the jet pump. By using a catalyst, the yield and selectivity of the reaction can be increased additionally.

The process temperature is preferably about 70° C.

The recovery of the pure vinyl chloride product from the product stream can preferably be effected by means of distillation, in which process all of the undesired components are separated. The high-purity vinyl chloride thus obtained can, for instance, be used as a monomer for the production of PVC.

To increase the efficiency of the method, the unconsumed process gas contained in the product stream can be fully or partially recycled to the plasma reactor. This procedure is applicable to all methods described herein.

Further, it is advantageous to fully or partly separate the hydrogen also contained in the product stream (which hydrogen is obtained in the plasma-catalytic reaction as by-product) from the product stream by means of a corresponding separator (e.g. based on pressure swing adsorption or membrane filtration (e.g. by means of palladium, hollow fiber membranes)), and optionally to use said hydrogen for further syntheses. In the above-described process for the production of vinyl chloride, about 3 mol of hydrogen are obtained per mole of vinyl chloride, with 0.5 mol of hydrogen being consumed in continuous operation (for HCl and for the vinyl chloride synthesis). The excess hydrogen (about 2.5 mol per mole of vinyl chloride) can be separated in the manner described.

2) Plasma-Catalytic Conversion of Methane to Vinyl Acetate

Methane, or a methane-containing gas, or another hydrocarbon-containing gas/gas mixture is reacted under the action of a plasma (preferably in a microwave reactor according to the invention) to give activated intermediate products.

As with the method (1) described further above, in this case, too, a liquid jet pump downstream of the plasma reactor is used in order to convey the product stream (together with the intermediates mentioned). Here, acetic acid (up to 100%) is added to the motive fluid (pumping liquid), serving as a further reactant (starting material). As mentioned further above, in the mixing chamber of the jet pump the product stream conveyed by the pump is mixed with the motive fluid (pumping liquid) of the pump—and with reactants contained therein (here: acetic acid).

The reaction of the intermediate products contained in the product stream with the acetic acid admixed to the motive fluid enables the formation of vinyl acetate.

Alternatively, the intermediate products contained in the product stream can be reacted with acetic acid by passing the product stream through a (gas) scrubber whose washing liquid (scrubbing medium) contains acetic acid.

Both methods can also be combined to optimize yields.

In order to increase yield and selectivity, in this case, too, a catalyst can be used which may, for example, be mixed with the motive fluid of the pump. Suitable catalysts for this synthesis reaction are, in particular, zinc acetate/activated carbon and/or $HgCl_2$/activated carbon.

3) Plasma-Catalytic Conversion of Methane to Acrylonitrile

Methane or a methane-containing gas or another hydrocarbon-containing gas/gas mixture is converted, under the action of a plasma, to activated intermediate products—as described above. As a motive fluid (scrubbing agent), hydrogen cyanide (HCN) is used. By reaction with HCN, acrylonitrile is formed.

The hydrogen cyanide used in this method may also be generated plasma-catalytically (see below). By combining (e.g., parallel, consecutive or coordinated implementation of) the two methods, the hydrogen cyanide produced in a first method can be used as a starting material, that is, reactant, in the second method (conversion to methane to acrylonitrile).

4) Plasma-Catalytic Conversion of Methane to Vinyl Ether

Analogously to the methods described in 2), methane or another hydrocarbon-containing gas/gas mixture is converted under the action of a plasma, wherein the corresponding alcohol is used as motive fluid (scrubbing agent), as a further starting material (i.e. as a reactant). For example, the use of methanol yields methyl vinyl ether, the use of ethanol yields ethyl vinyl ether, etc.

Suitable catalysts are, for example, alkali metal hydroxides and/or alkali metal alkoxides.

5) Plasma-Catalytic Production of Methanol

By plasma-catalytic reaction of $CH_4$ (or other hydrocarbon-containing gas or gas mixture) with $CO_2$ and/or $H_2O$, synthesis gas (CO, $H_2$) is generated, from which, by means of catalytic synthesis, methanol can be obtained. Cu-, Zn- and Cr-containing catalysts or $ZnO/Cr_2O_3$ catalysts can be used as catalysts. The catalysts may, as mentioned, be admixed to the motive fluid or the scrubbing liquid.

With regard to the selectivity of the process, the use of a plasma reactor having a tubular recipient with a diameter of at least 4 cm, preferably 6 to 20 cm, or greater, has been found to be particularly favorable.

6) Plasma-Catalytic Conversion of Methane to Propargyl Alcohol and But-2-yne-1,4-diol (2-butyne-1,4-diol)

Analogously to the method described in 2), methane, or another hydrocarbon-containing gas or gas mixture, is converted under the action of a plasma, wherein formaldehyde is used as motive fluid (scrubbing agent), as a further starting material (i.e., as a reactant).

Cu(I) salts or Cu acetylide, for example, can be used as the catalyst. The process is usually carried out at pressures of 1 to 20 bar, at a temperature of 90-150° C.

The hydrogen obtained in the above-described method can be used in a subsequent step to hydrogenate but-2-yne-1,4-diol, whereby butane-1,4-diol is obtained.

7) Plasma-Catalytic Conversion of Methane to Methylbutynol

Analogously to the procedures described in 2), methane, or another hydrocarbon-containing gas or gas mixture, is converted under the action of a plasma, wherein acetone is used as the motive fluid (scrubbing agent), as a further starting material (i.e., as reactant).

8) Plasma-Catalytic Conversion of Methane to Acrylic Acid

Analogously to the procedures described in 2), methane or another hydrocarbon-containing gas or gas mixture is converted under the action of a plasma, wherein water may be used as the motive fluid (scrubbing agent).

Methane or a methane-containing gas is converted plasma-catalytically, and acetylene contained in the product stream is reacted—possibly after separation by scrubber or the like—with water and carbon monoxide, preferably by using a catalyst (for example as a fixed bed catalyst or fixed bed reactor), whereby acrylic acid is obtained. Nickel tetracarbonyl, for example, is suitable as a catalyst.

The carbon monoxide required for the production of acrylic acid can be produced in a second plasma-catalytic process (synthesis gas production; see 5)) or is produced in such a process.

Through combination (e.g., parallel, successive, i.e., serial, or through coordinated implementation) of the two methods, the CO produced in a first process can be used as starting material or reactant in the second process (conversion to methane to acrylic acid). This enables a precise adjustment of the composition of the reactant gas used.

Alternatively, the carbonylation, which follows the plasma-catalytic reaction, may be effected under pressure and by using carbonyl-forming metals (e.g., Fe, Ni, Co) as catalyst(s).

9) Plasma-Catalytic Conversion of Methane to Acrylic Esters

Analogously to the procedure described in 2), methane, or another hydrocarbon-containing gas or gas mixture, is converted under the action of a plasma, wherein as the motive fluid (scrubbing agent), the corresponding alcohol is used (depending on the nature of the desired ester).

As described under 8) the carbon monoxide also required for the plasma-catalytic conversion of methane can be generated in a second plasma-catalytic process.

Alternatively, the carbonylation, which follows the plasma-catalytic reaction, may be effected under pressure and by using carbonyl-forming metals (e.g., Fe, Ni, Co) as catalyst(s).

10) Plasma-Catalytic Conversion of Methane to Acrylamides

Analogously to the procedure described in 2), methane, or another hydrocarbon-containing gas or gas mixture, is converted under the action of a plasma, wherein as the motive fluid (scrubbing agent), the corresponding secondary amines are used (depending on the nature of the desired amide).

As described under 8), the carbon monoxide additionally required for the plasma-catalytic conversion of methane can be generated in a second plasma-catalytic process.

Alternatively, the carbonylation, which follows the plasma-catalytic reaction, may be effected under pressure and by using carbonyl-forming metals (e.g., Fe, Ni, Co) as catalyst(s).

11) Plasma-Catalytic Conversion of Methane to Benzene and Styrene

A product gas produced by plasma-catalytic reaction of methane (or a methane-containing gas or other hydrocarbon-containing gas/gas mixture) is reacted in the presence of suitable catalysts (e.g., tricarbonyl nickel complexes) to benzene and styrene.

12) Plasma-Catalytic Conversion of Methane to Cyclooctatetraene

A product gas produced by plasma-catalytic reaction of methane (or of a methane-containing gas) is reacted in the presence of suitable catalysts (e.g., nickel(II) cyanide, $CaC_2$, tetrahydrofuran) to cyclooctatetraene; this reaction is conducted at elevated temperature and elevated pressure (especially at 60° C., 15 bar).

13) Plasma-Catalytic Conversion of Methane to Vinylacetylene

A product gas produced by plasma-catalytic conversion of methane (or a methane-containing gas) or other hydrocarbon-containing gas/gas mixture is converted to vinylacetylene in the presence of a catalyst (preferably copper(I) chloride). This catalytic conversion is preferably carried out by means of a liquid jet pump, wherein the catalyst is admixed to the motive fluid, or by means of a gas scrubber, with the catalyst being admixed to the scrubbing liquid (see 2) above).

14) Plasma-Catalytic Conversion of Methane to Chloroprene (2-Chloro-1,3-Butadiene)

The method as described in no. 13, but with an additional process step in which the vinylacetylene obtained is converted with hydrochloric acid to chloroprene (2-chloro-1,3-butadiene).

15) Modification of the Synthesis Methods Nos. 1 to 14

According to the present invention, any hydrocarbons can be used as a starting material in the above methods. These include methane-containing gases (such as natural gas, biogas or pyrolysis oils) and higher hydrocarbons ($>C_2$; in particular $C_2$ to $C_{12}$), saturated and unsaturated hydrocarbons (alkanes, alkenes, alkynes), branched and cyclic hydrocarbons.

16) Preparation of Pigment Black (Carbon Black), Optionally with Functionalization Pigment black is obtained by plasma-catalytic treatment, in particular by means of low-temperature plasmas, of methane (or of a methane-containing or hydrocarbon-containing gas). Functionalization of the pigment black particles, for example with Si, $N_2$ or halogens (e.g., F, Cl, Br), can be achieved by adding appropriate reactants or precursor compounds (e.g., silicone compounds, halogen, hydrogen halides). These reactants can be introduced into the plasma reactor, in which takes place the plasma-catalytic production of pigment black. In order to promote the formation of carbon black, it can be advantageous to remove all or part of the hydrogen formed during the plasma-catalytic conversion from the product gas by using suitable methods (see above), or to reduce the amount of hydrogen in the plasma reaction space. Furthermore, the formation of carbon black (pigment black) in the plasma-catalytic production of methane (or other hydrocarbons) can be promoted by increasing the pressure prevailing in the plasma space (plasma chamber, reaction chamber) (positive pressure, up to several MPa; >1,013.25 hPa).

17) Preparation of CN Compounds

CN compounds (nitriles, cyanogen compounds), particularly hydrogen cyanide (HCN), can be obtained with the inventive plasma-catalytic methods by converting methane (or a methane-containing gas, or other hydrocarbons) together with nitrogen under the action of a plasma, in particular of a microwave plasma. Preferably, this is followed by at least one process of material separation, for example by means of a gas scrubber, to obtain the individual products.

The plasma-catalytically produced hydrogen cyanide can be used as a starting material, that is, reactant, in a further synthesis method, which is preferably likewise a plasma-catalytic process; for example, to generate nitriles (see 3. above).

18) Preparation of Ethylene

For the production of ethylene, methane or a methane-containing gas is plasma-catalytically converted, with acetylene being formed as an intermediate product. Acetylene is then converted by selective catalytic hydrogenation to ethylene (for example, platinum catalysts, palladium catalysts or nickel catalysts).

19) Plasma-Catalytic Preparation of Ammonia (i) Hydrogen and nitrogen are plasma-catalytically converted, preferably in the (molar) ratio of 3:1, thereby forming ammonia, which is separated from the product stream by means of suitable devices (e.g., gas scrubber).

(ii) Hydrogen, which is required as starting material, can likewise be produced plasma-catalytically by a method according to the present invention (see above, no. 5), with methane (or a methane-containing gas) being converted with $H_2O$ and/or $CO_2$ to CO and $H_2$. The hydrogen so produced may be separated by known methods and used as a starting material in the production method (ii) described above for producing ammonia.

The plasma-catalytic ammonia synthesis process described above thus serves as another example of the aforementioned combination of two (or more) plasma-enhanced methods, wherein a product of the one plasma-catalytic process can serve as a starting material of another plasma-catalytic process.

The plasma-catalytic processes described above (Nos. 1 to 19) represent examples of embodiments, which can, either individually or in various combinations, each form the subject matter of one or more of the patent claims. Furthermore, each of these embodiments can be combined with one or more feature(s) from the foregoing description of the invention.

The present invention further relates to a device comprising a plasma reactor for carrying out plasma-catalytic processes, in particular for carrying out the plasma-catalytic methods described in the preceding part of this description.

An inventive device has the following characteristics and components:

a) a plasma reactor, comprising
- a plasma chamber in which a substantially tubular recipient made of a microwave-transparent, dielectric material is arranged, with the interior of the recipient serving as a reaction space;
- one or more inlet openings and/or feed lines for the introduction of fluid substances, particularly gaseous starting materials and/or inert gases, into the reaction space;
- one or more outlet openings and/or discharge lines for discharging the product stream, containing the reaction product(s), from the reaction space;
- a plasma source disposed on the plasma chamber and/or connected to this plasma chamber, in particular a microwave plasma source, for generating a plasma in the plasma chamber;

b) a jet pump downstream of the plasma reactor, which is connected to the reaction space via said discharge line or via at least one of the discharge lines.

Preferably, the plasma chamber is made of metal and is cylindrical (tubular), has a relatively large volume (0.5-10 l, in particular 1-5 l), and is designed such that it can be traversed by gases. The tubular recipient forming the reaction space is made of a microwave-transparent dielectric material, such as quartz, borosilicate glass, $Al_2O_3$ or ceramics. The cylindrical wall of the recipient is arranged substantially parallel to the wall of the plasma chamber.

It has surprisingly been found that the diameter of the dielectric tube (i.e., the recipient) has a significant impact on the energy efficiency and on the selectivity of plasma processes, in particular of the methods according to the present invention. According to a preferred embodiment it is therefore provided for the diameter of the tubular recipient to be at least 4 cm; this diameter may also be greater, especially 6 to 20 cm or larger, for example.

Hence, according to a further embodiment, the invention relates to a device comprising a plasma reactor which comprises
- a plasma chamber having a tubular recipient disposed therein, said recipient being made of a microwave-transparent, dielectric material, with the interior of said recipient serving as a reaction space,
- one or more inlet openings and/or feed lines for introducing fluid substances, particularly gaseous starting materials and/or inert gases, into the reaction space;
- one or more outlet openings and/or discharge lines for discharging the product stream, containing the reaction product(s), from the reaction space, and
- a plasma source, disposed on the plasma chamber and/or connected to this plasma chamber, in particular a microwave plasma source, for generating a plasma in the plasma chamber;

wherein the diameter of the tubular recipient is at least 4 cm, preferably 6 to 20 cm or larger.

In other applications, however, it may be advantageous if the diameter of the recipient is less than specified above. For example, this may be the case when the wall of the recipient consists of one or more catalysts, or contains one or more catalysts, so that the wall of the recipient also serves as a catalyst for a reaction taking place in the reaction space, for example when using $Al_2O_3$ or a tube made of $Al_2O_3$ as a recipient (reaction chamber). Due to the smaller diameter of the recipient, a greater plasma-wall interaction is obtained, that is, the interaction of the reactants present in the recipient with the catalytically active wall of the recipient is improved.

According to another preferred embodiment, the device comprises a plasma reactor which comprises
- a plasma chamber having a tubular recipient disposed therein, said recipient being made of a microwave-transparent, dielectric material, with the interior of said recipient serving as a reaction space,
- one or more inlet openings and/or feed lines for introducing fluid substances, particularly gaseous starting materials and/or inert gases, into the reaction space;
- one or more outlet openings and/or discharge lines for discharging the product stream, containing the reaction product(s), from the reaction space, and
- a plasma source, disposed on the plasma chamber and/or connected to this plasma chamber, in particular a microwave plasma source, for generating a plasma in the plasma chamber;

wherein the wall of the recipient is made of a catalyst or contains a catalyst.

The wall of the recipient may be made of one or more catalysts or contain one or more catalysts (e.g., $Al_2O_3$), so that the wall of the recipient at the same time serves as a catalyst for a reaction taking place in the reaction space.

Generally, the plasma chamber further comprises means for feeding (i.e., coupling) microwave radiation and for generating a plasma in the plasma chamber. Usually, these means (or "coupling points") are openings, in particular slots, which are arranged, preferably regularly, in the wall of the plasma chamber, or they are other antennas.

The plasma chamber is typically formed as a cylindrical resonator, which is surrounded at least partly by a preferably annular plasma resonator (or coaxial resonator) comprising a microwave generator for generating a plasma. Via the coupling points mentioned, the microwave power can be coupled into the plasma chamber, whereby a plasma is formed in the plasma chamber.

Plasma reactors having the design characteristics described above are known to those skilled in the art. For example, the plasma reactors described in WO 2004/010454 A2 and DE 10 2012 007 230.9 can be used for the purposes of the present invention.

A plasma source which is advantageous for the device has a reaction space in which a plasma can be generated and to/from which gases/substances can be fed and discharged. Preferably, the gases/substances are passed through the plasma source in a tube. Other features may be present, and advantageous, in addition, but they are not mandatory.

The plasma reactor of the device of the present invention further comprises one or more inlet openings and/or feed lines for passing fluid substances, particularly gaseous starting materials and/or inert gases, into the reaction space, and one or more outlet openings and/or discharge lines for discharging the product stream, containing the reaction product(s), from the reaction space. The aforementioned inlet openings, feed lines, outlet openings or discharge lines can be provided with means for shutting off or controlling the flow (e.g., valves).

Furthermore, a preferred embodiment of the device according to the invention comprises at least one pump downstream of the plasma reactor, such as a rotary vane pump or jet pump (in particular, a liquid jet pump), which is connected to the reaction space via said discharge line or via at least one of the discharge lines.

A jet pump downstream of the plasma reactor on the one hand enables the product stream generated in the plasma reactor or plasma chamber (and containing the reaction products of the plasma-catalytic reaction(s)), to be discharged from the plasma reactor, or the plasma chamber, and allows setting the desired process pressure, and, on the other hand, this opens the possibility of mixing reactants, catalysts, etc., with the product stream via the motive fluid (pumping liquid) used. The general operating principle of such a jet pump is known to those skilled in the art.

In this way, it is possible, through addition of selected reactants (or further starting materials), to add catalysts, etc., to the motive fluid, or, through the use of a motive fluid having selected solution properties, to achieve further conversions or modifications of the plasma-catalytic (intermediate) products contained in the product stream.

For this purpose, the jet pump may be connected to a reservoir for the pumping liquid (motive fluid). The above-mentioned reactants, catalysts, solvents, etc., can be admixed to the motive fluid stored in the reservoir.

Furthermore, it is preferable that the above-mentioned jet pump(s) can be adjusted or automatically controlled and have appropriate devices for the open-loop or closed-loop control of the pump capacity. As a result, the pressure prevailing in the reaction space can be adjusted or automatically controlled by means of closed-loop control or open-loop control of the pump capacity.

As noted, setting a pressure difference or pressure gradient in the plasma reactor (and thus in the reaction chamber) is advantageous. Therefore, according to a further embodiment, the device is equipped with one or more devices that allow the setting or automatic control of a pressure difference or pressure gradient. These devices are preferably selected from the following group: valve(s) on the feed line(s) or at the inlet openings of the reactor; pump(s) or compressor(s) on the feed line(s); valve(s) on the product line(s) or at the outlet openings of the reactor; pump(s) on the product line(s) or at the outlet openings of the reactor. The aforementioned jet pumps (e.g., liquid jet pumps) can be used to adjust or automatically control a pressure difference or pressure gradient.

According to a preferred embodiment, the inventive device has one or more devices for fractionating, concentrating and purifying the product stream, preferably selected from the group comprising fractionating columns, rectification columns, distillation columns, stripper columns, separators, adsorbers, gas scrubbers and cyclones.

The design and operating principle of such devices are known to those skilled in the art.

Preferably, the inventive device has at least one device for separating one or more substances, particularly reaction products, from the product stream, preferably a device for separating hydrogen. The design and operating principle of such devices are known to the person skilled in the art. For separating hydrogen, devices for carrying out pressure swing adsorption methods (PSA) or (palladium) membrane filtration methods are particularly suitable.

Furthermore, the device of the invention may include one or more devices (e.g., pipes, valves) which allow recycling one or more product fractions or substances contained in the product stream, especially starting materials, process gas or process gas constituents, into the reaction space.

Preferably, these recycling devices are combined with the aforementioned separation devices in such a way that one or more substances (e.g., hydrogen, methane) separated from the product stream are recycled to the reaction space.

According to another embodiment of the invention, the device comprises one or more heat exchangers which allow using the process heat generated. The design and operating principle of such heat exchangers are known to those skilled in the art.

According to a further preferred embodiment of the device according to the invention, a first plasma reactor is connected via at least one connecting line to the reaction space of a second or further plasma reactor, which is preferably operated in parallel to or in series or coordinated with the first plasma reactor. In this way it is, for example, possible to perform synthesis processes of the invention in such a way that a plasma-catalytically produced product (or intermediate product) is used as a starting material in a further plasma-catalytic process, as described further above, or that two plasma processes supply material to a third process.

In this case, it may be advantageous if the mentioned connecting line has one or more intermediately arranged devices for conveying, fractionation, concentration and purification, so that the said intermediate product can be purified and/or concentrated before it is used as a starting material in a further plasma-catalytic process.

The invention also includes those embodiments of the device in which one or more components or features are doubly or multiply present. For example, two or more plasma reactors can be combined or connected to each other in order to obtain a production plant which enables the implementation of multi-stage synthesis routes or the production of further products, for example by derivatization. Likewise, the aforementioned devices for fractionating, concentrating, purifying, etc., and/or the aforementioned recycling devices, for example, may be doubly or multiply present.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
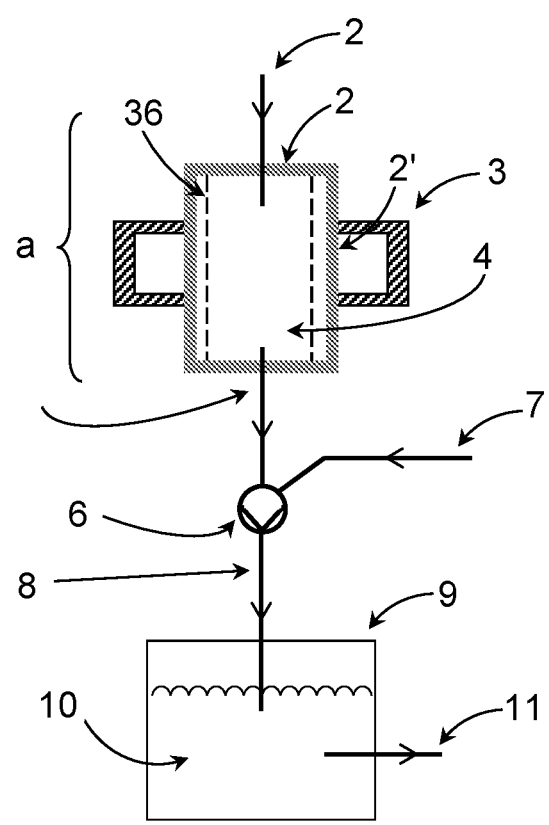
FIG. 1 is a schematic sectional view of a first embodiment of the device according to the invention.

The device of FIG. 1 comprises a plasma reactor (a), which has a cylindrical plasma chamber (2) that is surrounded by an annular resonator (3). In the common wall (2') of the resonator (3) and plasma chamber (2) there are coupling points (in the form of regularly arranged slots; not shown) for coupling the microwave radiation into the plasma chamber. The interior of the plasma chamber (2) forms the reaction space (4), which is defined by a cylindrical recipient (36) made of a dielectric material (e.g., quartz glass).

The plasma chamber has a feed line (1) for passing starting materials (reactants) into the plasma chamber (2) and thereby the reaction space (4), and a line (5) for discharging the product stream from the reaction space.

Located downstream of the plasma reactor (a) there is a jet pump (6), in which a suction or pumping action is generated by a motive fluid, whereby the product stream is conveyed through line (5) in the direction of the arrows, and/or whereby a pressure gradient is generated in the plasma reactor. The motive fluid is fed via the feed line (7), from a reservoir. The motive fluid may, as explained above, contain reactants, catalysts, solvents, etc. For example, the motive fluid may contain hydrogen halide, e.g., HCl, to produce the corresponding halogenated products (such as vinyl chloride, as described further above).

In the jet pump (6), a mixing of product stream and motive fluid (and optionally of the reactants, etc., contained therein) occurs.

The embodiment shown in FIG. 1 of the device comprises a line (8) via which the product stream conveyed by the pump (6) is introduced into the washing liquid (10) of a washer (9). The washing liquid may, for example, contain reactants and/or catalysts to further convert the products, as described further above.

Via the product line (11), the product-containing washing liquid can be removed.

Figure 2:
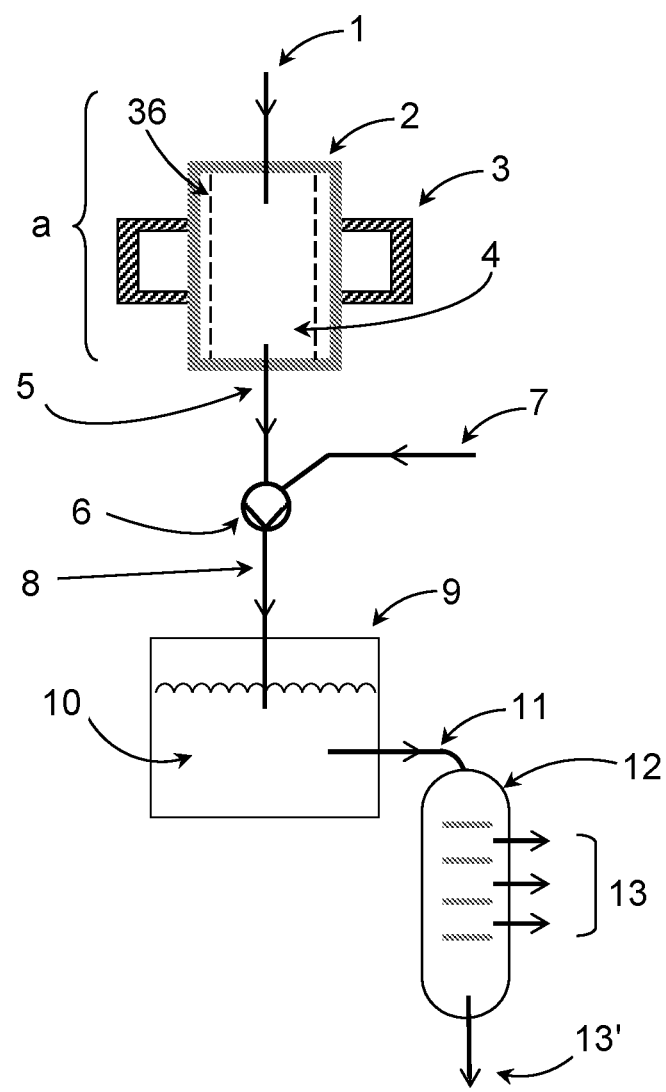
FIG. 2 is a schematic sectional representation of a second embodiment of the device according to the invention, which is a modification of the embodiment shown in FIG. 1.

The device shown in FIG. 2 additionally includes technical devices by means of which the product-containing washing liquid conveyed via the product line (11) may be fractionated and/or purified. For this purpose, the reaction products contained in the washing liquid are passed, via the product line (11), through a fractionating column (12), whereby different product fractions (13, 13') can be obtained.

Figure 3:
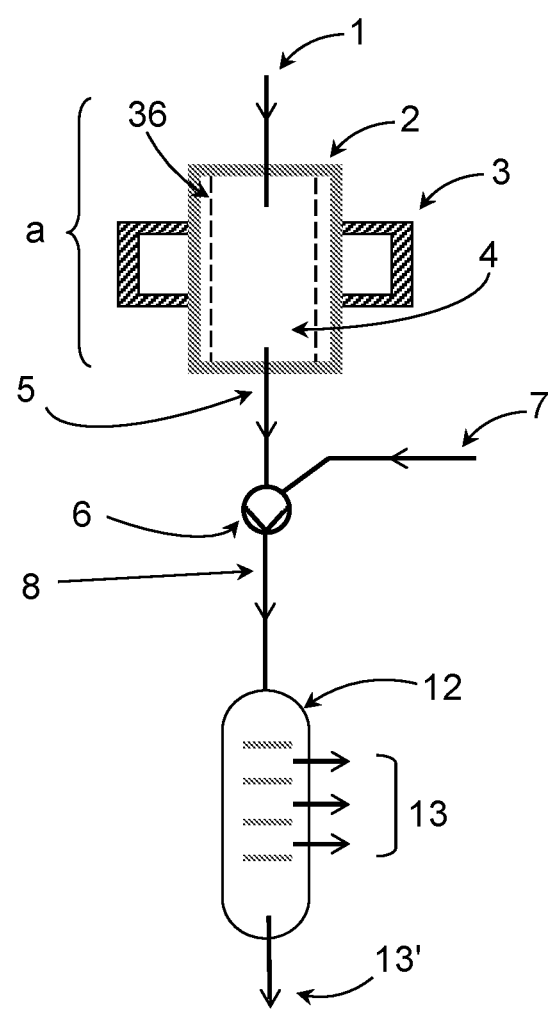
FIG. 3 is a schematic sectional representation of a third embodiment of the device according to the invention, which is a modification of the embodiments shown in FIGS. 1 and 2.

The device shown in FIG. 3 has a fractionating column (12) as shown in FIG. 2. However, in this case the product stream conveyed by the jet pump (6) (mixed with the motive fluid of the pump) is directly, via a line (8), introduced into the fractionating column (12).

Figure 4:
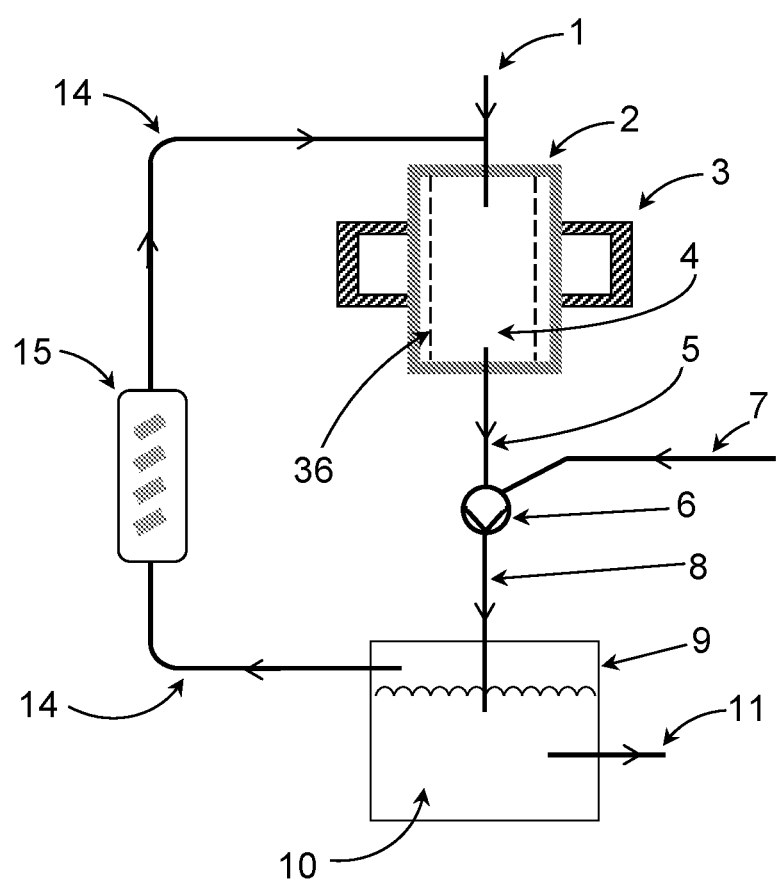
Fig. 4 is a schematic sectional representation of a fourth embodiment of the device according to the invention, which is a modification of the embodiment shown in FIG. 1.

The device shown in FIG. 4 additionally has a line (14) by means of which process gases (or part of the process gases) can be recycled into the plasma reactor in a circuit (gas recycling (14)). In the embodiment shown in FIG. 4, the process gases are removed from the gas scrubber (9), but the process gases may also be removed at another location (for example, line (8)).

In addition, in the gas recycling (14) there can be provided at least one intermediately arranged separator or absorber (15) which allows individual constituents (e.g., hydrogen) to be fully or partially removed from the process gas before it is returned to the plasma reactor.

Figure 5:
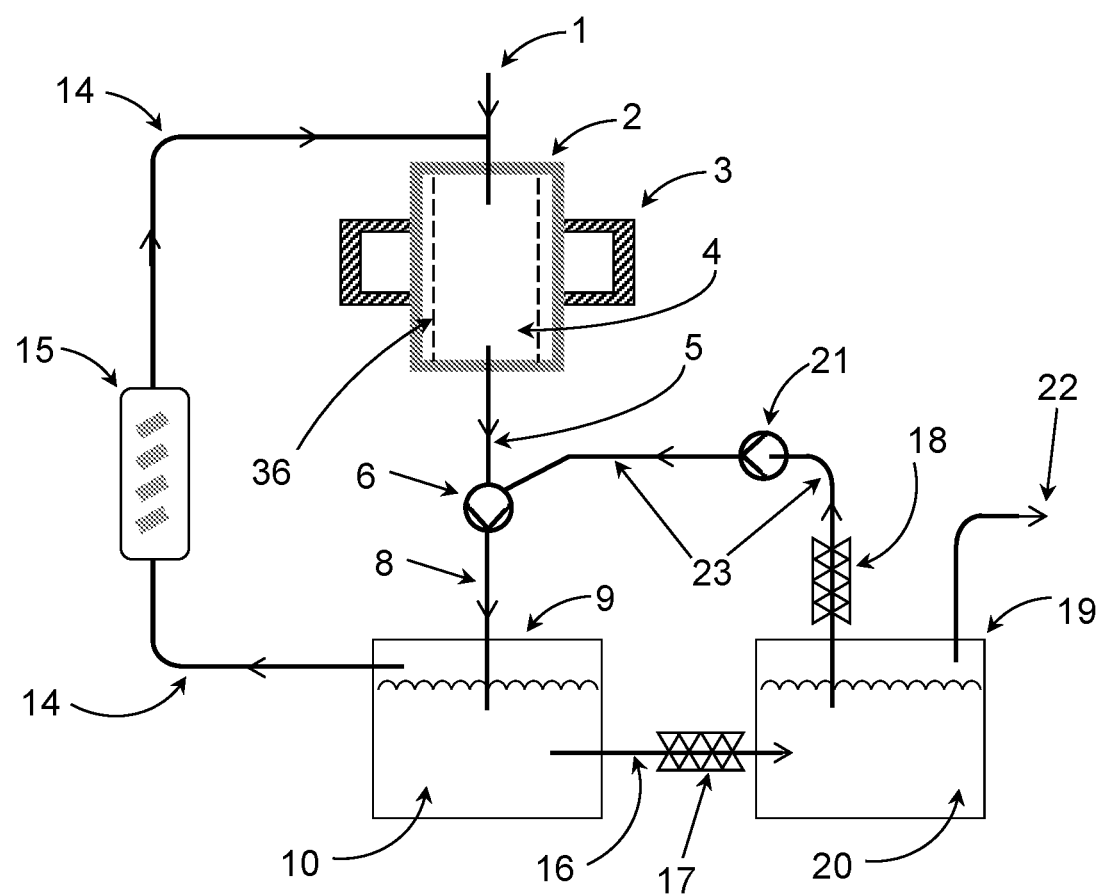
FIG. 5 is a schematic sectional representation of a fifth embodiment of the device according to the invention, which is a modification of the embodiment shown in FIG. 4.

The device shown in FIG. 5 has a second scrubber or scrubbing tank (19) containing a second scrubbing liquid (20) which may, for example, contain catalysts for a further reaction of the products introduced via line (16). The desired end products are removed via the product line (22). Line (23) serves to recycle unreacted starting materials (or intermediate products) into the motive fluid of the jet pump (6); a feed pump (21) can be arranged at an intermediate location.

FIG. 5 also shows heat exchangers (17, 18) which serve to dissipate the generated process heat to make it available to other processes (for example, for the heating of fractionating columns).

Figure 6:
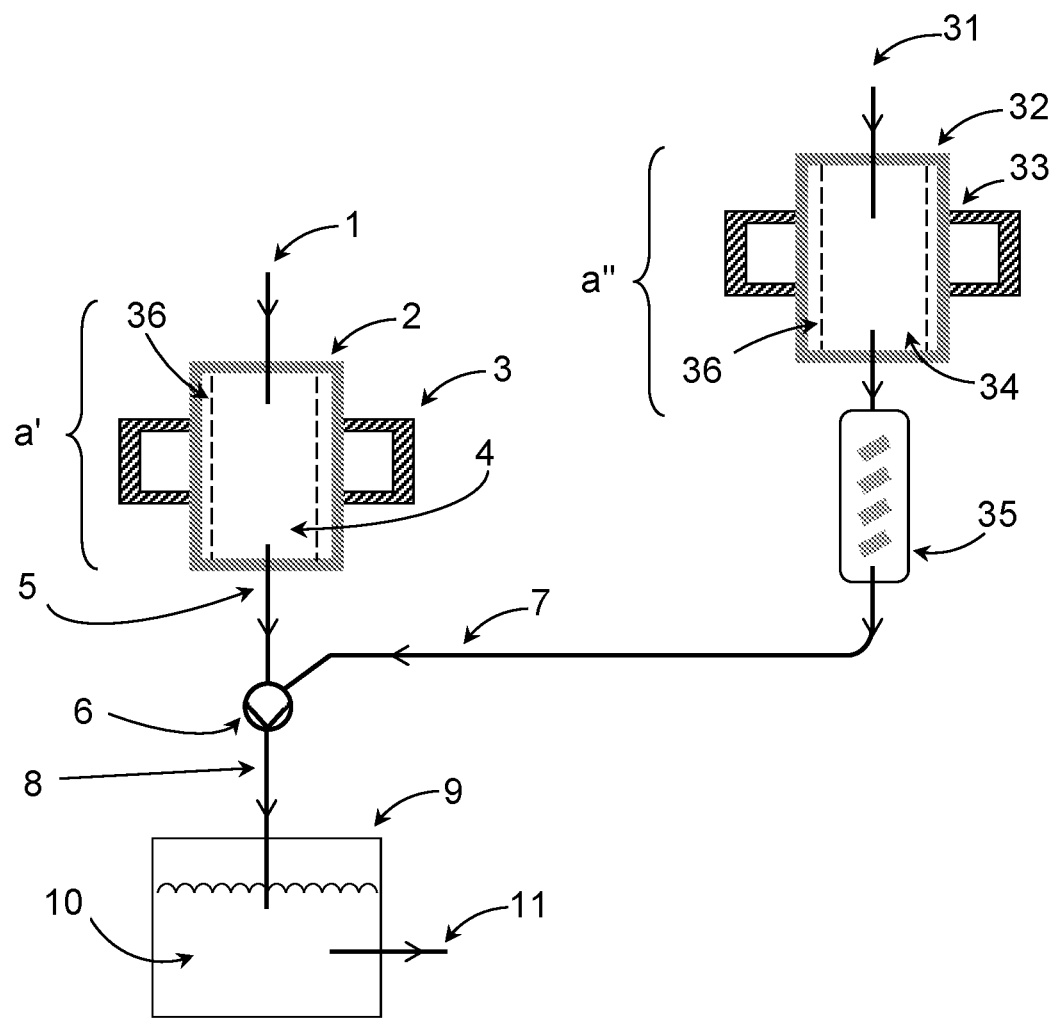
FIG. 6 is a schematic sectional representation of a sixth embodiment of the device according to the invention, which is a modification of the embodiment shown in FIG. 1, wherein two plasma reactors (a', a'') are combined.

The plasma-catalytic method carried out by means of plasma reactor (a'') shown in FIG. 6 yields a reactant or starting material which is fed, via line (7), to the jet pump (6) (additionally, a pumping liquid can be fed via a reservoir, as shown in FIG. 1). The product stream coming from the plasma reactor (a'') may be subjected to fractionation by means of column (35).

In the jet pump (6) a mixing—similar to that described with respect to FIG. 1—occurs of the product stream from the plasma reactor (a') and the motive fluid, which comprises the reactants produced by means of plasma reactor (a'').

FIG. 6 thus shows an embodiment in which two plasma reactors are combined in a device according to the invention in a manner such that a product produced in a first plasma-catalytic process is used as a reactant (starting material) in a second plasma-catalytic process to obtain a desired end product.

Figure 7:
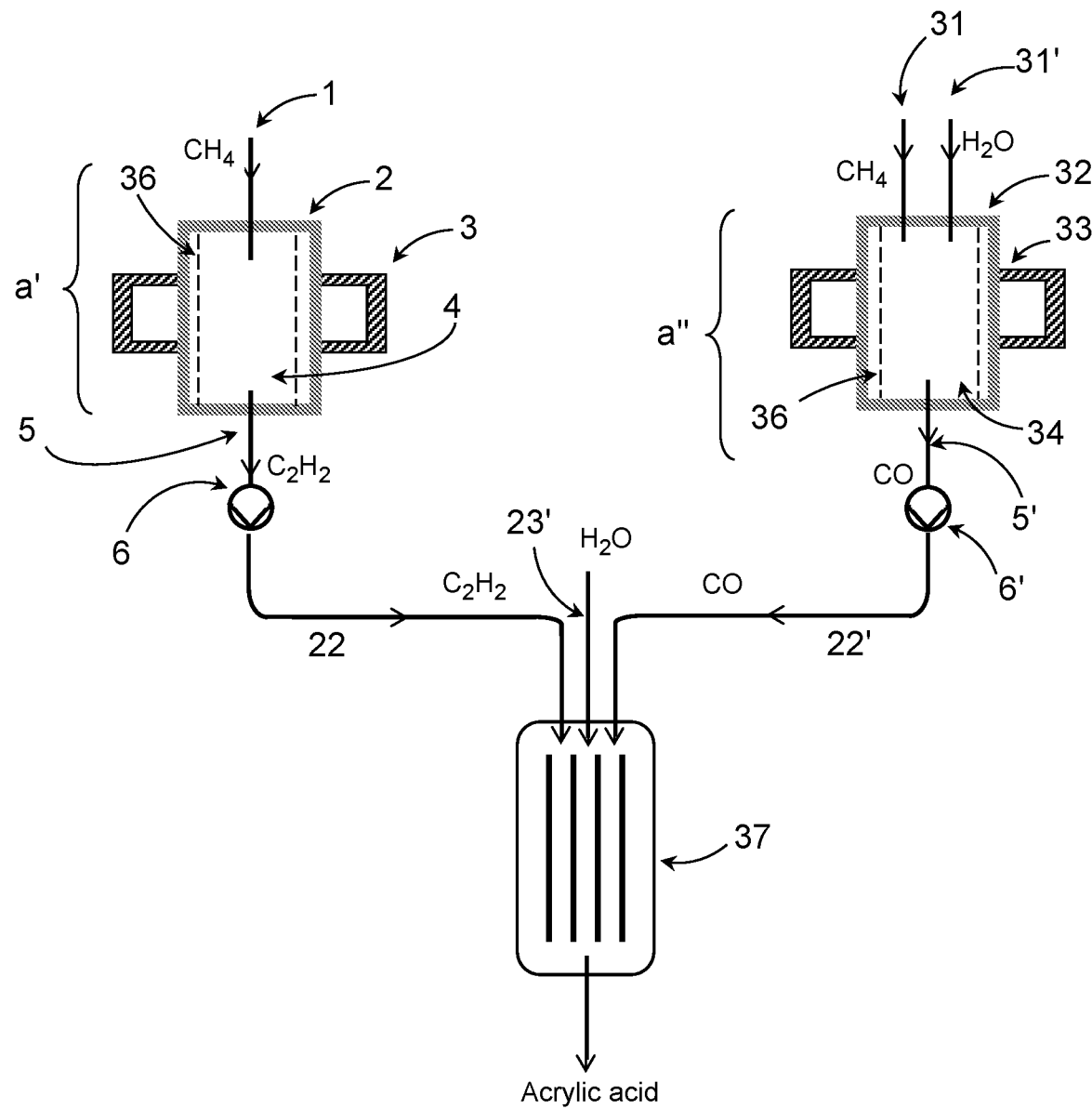
FIG. 7 is a schematic sectional representation of a seventh embodiment of the device according to the invention, which is a modification of the embodiment shown in FIG. 6 and wherein two plasma reactors (a', a'') are combined with one another.

The embodiment shown in FIG. 7 is suitable, for example, for carrying out the method described above under item 8 for the plasma-catalytic conversion of methane to acrylic acid.

A first plasma reactor (a') is used for the plasma-catalytic conversion of methane (or a methane-containing gas) to acetylene. The acetylene present in the product stream is fed via lines (5, 22), optionally by means of a pump or a compressor (6), to a fixed bed reactor (37) where it is catalytically reacted with water and carbon monoxide to acrylic acid. A suitable catalyst is nickel tetracarbonyl, for instance.

The carbon monoxide required as a reactant is, according to the embodiment shown here, generated by a second plasma reactor (a''); for example, from methane (or a methane-containing gas mixture) and water according to the reaction equation $CH_4+H_2O \rightarrow CO+3H_2$, with $H_2O$ preferably being used in excess (plasma-catalytic synthesis gas generation).

Alternatively, the carbon monoxide required as a reactant may be produced plasma-catalytically from other starting materials; for example, according to the reaction equation $CH_4+CO_2 \rightarrow 2\ CO+2H_2$.

The starting materials used for the plasma-catalytic production of CO (in this case: $CH_4$, $H_2O$) are introduced via lines (31, 31') into the reaction space of the reactor. The plasma-catalytically generated CO is conducted via product lines (5', 22'), optionally by means of a pump or a compressor (6'), into the fixed bed reactor.

If necessary, the hydrogen generated in the reactor (a") can be separated from the CO-containing product stream by suitable devices (not shown).

If necessary, (in addition) $H_2O$ may be fed into the fixed bed reactor via a line (23').

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A method for the plasma-catalytic conversion of materials, in particular for the production of key chemicals, wherein
    a hydrocarbon-containing starting material selected from the group consisting of natural gas, biogas, pyrolysis gas, methane, ethane, propane, butane, isobutane, liquid or gasifiable hydrocarbons, and combinations thereof is converted, under the action of a plasma, with at least one further starting material, to at least one product,
    or
    a hydrocarbon-containing starting material selected from the group consisting of natural gas, biogas, pyrolysis gas, methane, ethane, propane, butane, isobutane, liquid or gasifiable hydrocarbons, and combinations thereof is converted in a first method step, under the action of a plasma, to one or more intermediate products(s) which, in at least one subsequent method step, are converted to a reaction product,
    wherein the hydrocarbon(s) of the hydrocarbon-containing material consists of hydrogen and carbon,
    wherein the conversion under the action of plasma is effected in a plasma reactor with the plasma gas present in the plasma reactor, which plasma gas contains the products or intermediate product(s) produced, and wherein
    (i) the product(s) or intermediate product(s) produced by plasma-catalytic conversion is/are introduced into a gas scrubber comprising a scrubbing liquid containing at least one catalyst or at least one reactant, with at least one of these products or intermediate products being converted in the scrubbing liquid by the catalyst or reactant; or
    (ii) the starting materials introduced into the plasma reactor are conveyed by a liquid jet pump located downstream of the plasma reactor and the products or intermediate products are continuously removed from the plasma reactor by the liquid jet pump, wherein a solvent which contains at least one reactant and/or a liquid which contains at least one catalyst is/are used as a motive fluid of the liquid jet pump for further conversion of the products or intermediate products obtained,
    wherein the at least one reactant is selected from the group consisting of alcohols, esters, formaldehyde, acetone, hydrocarbons, and hydrogen cyanide (HCN).

2. The method according to claim 1, wherein the product(s) or intermediate product(s) produced by plasma-catalytic conversion is/are introduced into the scrubbing liquid, and wherein at least one of these products or intermediate products is soluble in the scrubbing liquid, or is precipitated in the scrubbing liquid.

3. The method according to claim 1, wherein the complete or partial conversion of the starting materials(s) is carried out using one or more catalysts.

4. The method according to claim 1, wherein the plasma is a non-thermal plasma.

5. The method according to claim 1, wherein the motive fluid of the liquid jet pump contains one or more reactants selected from the group consisting of alcoholates and esters.

6. The method according to claim 1, wherein the products or intermediate products formed by plasma-catalytic conversion is/are converted by at least one catalyst present in the scrubbing liquid.

7. The method according to claim 1, wherein methane, a methane-containing gas mixture, or ethylene is used as the hydrocarbon-containing starting material, and wherein the starting material is converted in a plasma reactor under the action of a plasma, with chlorine gas as a further starting material, to obtain vinyl chloride as a product.

8. The method according to claim 1, wherein a hydrocarbon or a mixture of two or more hydrocarbons is used as the starting material or as one of several starting materials, and that one or more of the substances listed below are obtained as product(s) or as intermediate product(s):
    vinyl esters, particularly vinyl acetate; acrylonitrile; ethers, especially dimethyl ether, diethyl ether, di-n-propyl ether; vinyl ethers, particularly methyl vinyl ether, ethyl vinyl ether, propyl vinyl ether, isopropyl vinyl ether; methanol, propargyl alcohol (2-propyn-1-ol), 2-butyn-1,4-diol, butane diols, particularly butane-1,4-diol, 2-methyl-3-butyn-2-ol (methyl butynol), 3-methyl-3-buten-1-ol (isoprenol), 3-methyl-but-1-yn-3-ol; unsaturated carboxylic acids, especially acrylic acid (propenoic acid) and methacrylic acid (2-methyl-propenoic acid); acrylic esters, particularly methyl acrylate, ethyl acrylate, butyl acrylate, isobutyl acrylate, 2-ethylhexyl acrylate; acrylamide (acrylic amide); carboxamides; vinyl halides, especially vinyl chloride; benzene, styrene, cyclooctatetraene; butenyne (vinylacetylene); chloroprene (2-chloro-1,3-butadiene); acetylene, ethylene; hydrogen cyanide and nitriles; carbon black.

9. The method according to claim 1, further comprising carrying out one or more further reactions of acetylene:
    addition of halogens;
    hydrogenation;
    conversion with acids;
    conversion with HCl to give vinyl chloride;
    carbonylation to give carboxylic acids;
    addition of alcohols; and
    addition of carboxylic acids.

10. The method according to claim 1, wherein methane or a methane-containing gas is plasma-catalytically converted, and the reaction products contained in the product stream are reacted with hydrogen cyanide (HCN) by using a motive fluid or scrubbing medium containing HCN, whereby acrylonitrile is obtained.

11. The method according to claim 1, wherein methane or a methane-containing gas is plasma-catalytically converted, and the reaction products contained in the product stream are reacted with an alcohol by use of a motive fluid or scrubbing medium containing the said alcohol, whereby the corresponding vinyl ether is obtained.

12. The method according to claim 1, wherein methane is plasma-catalytically converted with $CO_2$ and/or $H_2O$ to synthesis gas (CO, $H_2$), which is converted to methanol by catalytic synthesis using Cu-containing, Zn-containing, and/or Cr-containing catalysts.

13. The method according to claim 1, wherein methane or a methane-containing gas is plasma-catalytically converted, and the acetylene contained in the product stream is reacted with water and carbon monoxide, whereby acrylic acid is obtained.

14. The method according to claim 1 for the plasma-catalytic production of CN compounds or other nitrogen-containing compounds, wherein a methane-nitrogen mixture is converted under the action of a plasma.

15. The method according to claim 1, wherein the product(s) or intermediate product(s) produced by plasma-catalytic conversion is/are introduced into a scrubbing liquid containing at least one catalyst or at least one reactant, with at least one of these products or intermediate products being converted in the scrubbing liquid by the catalyst or reactant.

16. The method according to claim 1, wherein the starting material further comprises at least one compound selected from the group consisting of $CO_2$, CO, $H_2O$, $H_2$, $O_2$, and $N_2$.

17. The method according to claim 1, wherein the hydrocarbon-containing starting material does not contain any halogenated hydrocarbons.

18. A method for the production of key chemicals by plasma-catalytic conversion of starting materials, wherein a hydrocarbon-containing starting material selected from the group consisting of natural gas, biogas, pyrolysis gas, methane, ethane, propane, butane, isobutane, liquid or gasifiable hydrocarbons, and combinations thereof is converted, under the action of a plasma, with at least one further starting material, to at least one product, or a hydrocarbon-containing starting material selected from the group consisting of natural gas, biogas, pyrolysis gas, methane, ethane, propane, butane, isobutane, liquid or gasifiable hydrocarbons, and combinations thereof is converted in a first method step, under the action of a plasma, to one or more intermediate products(s) which, in at least one subsequent method step, are converted to a reaction product, wherein the hydrocarbon(s) of the hydrocarbon-containing material consist of hydrogen and carbon, and wherein the conversion under the action of plasma is effected in a plasma reactor with the plasma gas present in the plasma reactor, which plasma gas contains the products or intermediate product(s) produced, and wherein (i) the product(s) or intermediate product(s) produced by plasma-catalytic conversion is/are introduced into a scrubbing liquid containing at least one catalyst or at least one reactant, with at least one of these products or intermediate products being converted in the scrubbing liquid by the catalyst or reactant to produce said key chemical; or (ii) the starting materials introduced into the plasma reactor are conveyed by a liquid jet pump located downstream of the plasma reactor and the products or intermediate products are continuously removed from the plasma reactor by the liquid jet pump, wherein a solvent which contains at least one reactant and/or a liquid which contains at least one catalyst is/are used as a motive fluid of the liquid jet pump for further conversion of the products or intermediate products to produce said key chemicals.

19. The method according to claim 18, wherein the key chemicals produced by the method comprise halogenated compounds, and wherein said reactants comprise hydrogen halides.

20. The method according to claim 18, wherein the key chemical produced by the method is vinyl chloride, and wherein said motive fluid contains hydrochloric acid.

21. The method according to claim 18, wherein the key chemical produced by the method is vinyl acetate, and wherein said motive fluid or scrubbing medium contains acetic acid.

22. The method according to claim 18, wherein the key chemical produced by the method is acrylonitrile, and wherein said motive fluid or scrubbing medium contains HCN.

23. The method according to claim 18, wherein the key chemical produced by the method is a vinyl ether, and wherein said motive fluid or scrubbing medium contains the corresponding alcohol.

24. The method according to claim 18, wherein the key chemical produced by the method is an acrylic acid amine, and wherein said motive fluid or scrubbing medium contains the corresponding secondary amine.

25. The method according to claim 18, wherein the hydrocarbon-containing starting material does not contain any halogenated hydrocarbons.

26. A method for the plasma-catalytic conversion of materials, in particular for the production of key chemicals, wherein a hydrocarbon-containing starting material selected from the group consisting of natural gas, pyrolysis gas, biogas, methane, ethane, propane, butane, isobutane, liquid or gasifiable hydrocarbons and combinations thereof is converted, under the action of plasma, with at least one further starting material, to at least one product, or a hydrocarbon-containing starting material selected from the group consisting of natural gas, pyrolysis gas, biogas, methane, ethane, propane, butane, isobutane, liquid or gasifiable hydrocarbons and combinations thereof is converted in a first method step, under the action of plasma, to one or more intermediate product(s) which, in at least one subsequent method step, are converted to a reaction product, wherein the hydrocarbon(s) of the hydrocarbon-containing material consist of hydrogen and carbon, wherein the conversion under the action of plasma is effected in a plasma reactor, with the plasma gas present in the plasma reactor, which plasma gas contains the products or intermediate product(s) produced, and wherein (i) the product(s) or intermediate product(s) produced by plasma-catalytic conversion is/are introduced into a scrubbing liquid containing at least one catalyst, with at least one of these products or intermediate products being converted in the scrubbing liquid by the catalyst; or (ii) the starting materials introduced into the plasma reactor are conveyed by means of a liquid jet pump located downstream of the plasma reactor and the products or intermediate products are continuously removed from the plasma reactor by the liquid jet pump, wherein a liquid which contains at least one catalyst is/are used as a motive fluid of the liquid jet pump for further conversion of the products or intermediate products obtained.

27. The method according to claim 26, wherein the hydrocarbon-containing starting material does not contain any halogenated hydrocarbons.

\* \* \* \* \*